United States Patent [19]

Sakuda

[11] Patent Number: 4,747,650
[45] Date of Patent: May 31, 1988

[54] SEMICONDUCTOR OPTICAL AMPLIFIER
[75] Inventor: Kyohei Sakuda, Nagaoka, Japan
[73] Assignee: AMP Incorporated, Harrisburg, Pa.
[21] Appl. No.: 4,530
[22] Filed: Jan. 20, 1987
[30] Foreign Application Priority Data Feb. 20, 1986 [JP]  Japan ................................. 61-036248

[51] Int. Cl.[4] .............................................. G02B 6/10
[52] U.S. Cl. .................................... 350/96.14; 330/4.3;
350/96.13; 357/19; 372/50
[58] Field of Search ...................... 330/4.3; 350/96.11,
350/96.12, 96.13, 96.14; 357/19; 372/50

[56]  References Cited
U.S. PATENT DOCUMENTS

| | | | |
|---|---|---|---|
| 3,465,159 | 6/1966 | Stern | 330/4.3 X |
| 4,146,297 | 5/1979 | Alferness et al. | 350/96.14 |
| 4,240,693 | 12/1980 | Johnson et al. | 350/96.14 |
| 4,334,774 | 7/1982 | Glass et al. | 356/152 |
| 4,359,776 | 11/1982 | Acket et al. | 330/4.3 X |
| 4,698,821 | 10/1987 | Terakado et al. | 372/50 |

Primary Examiner—Gene Wan
Assistant Examiner—James C. Lee
Attorney, Agent, or Firm—Gerald K. Kita

[57] ABSTRACT

A semiconductor amplifying device 1 comprises, a substrate 2, a first optical waveguide 7 on the substrate 2 for transmitting an optical signal, a second optical waveguide 8 on the substrate 2, a third optical waveguide 11 on the substrate 2 forming an optical coupling with the first optical waveguide 7 along an interaction length and constructed as a semiconductor optical amplifier 11 that receives and amplifies at least a portion of the optical signal to the first waveguide 7, and antireflective means 16 covering light emitting edges 7a, 8a, 11a, 3a at corresponding ends of the respective waveguides 7, 8, 11 and an optical transmitting medium 3, the second optical coupling having a phase mismatch selected for a wavelength of the optical signal to provide for a power gain in the first optical waveguide 7 attributed to an amplified portion of the same wavelength of the optical signal coupled back from the amplifier 11.

4 Claims, 7 Drawing Sheets

SEMICONDUCTOR OPTICAL AMPLIFIER

FIELD OF THE INVENTION

The invention relates to a semiconductor optical amplifying device in which a semiconductor optical amplifier is coupled to a semiconductor signal transmitting waveguide that transmits an optical signal amplified by the amplifier.

BACKGROUND OF THE INVENTION

A semiconductor optical waveguide having a refraction index varied by a variable electrical field is known from the disclosure of U.S. Pat. No. 4,240,693, issued Dec. 23, 1980, to Johnson, Singh and Uitert, and from the disclosure of U.S. Pat. No. 4,334,774, issued June 15, 1982, to Glass, Kaminow and Olson.

Optical coupling of adjacent waveguides of a semiconductor device is known, for example, as described in U.S. Pat. No. 4,146,297, issued Mar. 27, 1987, to Alferness and Schmidt. Optical waveguides of a semiconductor device can be caused to be proximate each other for a predetermined interaction length separated by a gap. Optical energy transmitted by one of the optical waveguides along the interaction length is coherently coupled into the other waveguide. The waveguides are nonidentical and are fabricated to have respective dispersion (refraction) indices, dispersion characteristics versus wavelength, that are matching or nearly matching at only one wavelength, called the phasematched wavelength. Optical energy with wavelengths the same or nearly the same as the phasematched wavelength will couple from one waveguide to the other waveguide with higher coupling efficiencies than for energy with wavelengths remote from the phasematched value. The indicies can be selected to different values by varying the values of electrical fields established in the waveguides by pairs of electrodes juxtaposed over the two waveguides and along the interaction length. Upon reaching the desired phasematched wavelength, the electrical potentials of the respective pairs of electrodes are perturbed by voltages of equal value and opposite polarity thereby to increase the coupling efficiency.

SUMMARY OF THE INVENTION

A semiconductor optical amplifying device includes a first semiconductor waveguide for transmitting an optical signal, for forming an optical coupling with a second semiconductor waveguide, and for forming an optical coupling with a third semiconductor waveguide operating as an optical amplifier, and a light transmitting medium transmitting a portion of the optical signal between the signal transmitting waveguide, the second waveguide and the amplifier. A portion of the optical signal emanates by dispersion from the signal transmitting waveguide and is coupled into the second waveguide, and then is coupled into the amplifier, is amplified by the amplifier and is emanated as output from the amplifier. A portion of the amplifier output is coupled back to the signal transmitting waveguide and combined with an optical signal that becomes amplified by the coupled back output.

The amount of power gain in the amplified signal is dependent upon a phase mismatch of the coupling of the amplifier and the first waveguide, in combination with another phase mismatch of the coupling of the first and second waveguides. Without such phase mismatches, the power of the signal transmitted by the first waveguide will dissipate, despite availability of power gain from the amplifier output.

The amount of power gain for a wavelength of the optical signal can be adjusted and can be ascertained by selecting the amount of phase mismatch attributed to the optical coupling of the signal transmitting waveguide and the second waveguide that is interposed between the amplifier and the signal transmitting waveguide.

Accordingly, an object of the invention is to provide a semiconductor optical amplifying device with a waveguide interposed between a signal transmitting first waveguide and a waveguide constructed as an amplifier, wherein an optical coupling of selected phase mismatch is formed by the amplifier and the first waveguide, and another optical coupling of selected phase mismatch is formed by the second waveguide with the first waveguide.

Another object of the invention is to provide a semiconductor optical amplifying device wherein a waveguide is interposed between an optically coupled signal transmitting waveguide and a waveguide constructed as an amplifier, and provides an optical coupling of selected phase mismatch that ascertains the amount of power gain coupled by the amplifier across an optical coupling into the signal transmitting waveguide.

Other objects and advantages of the invention are apparent from the description that follows and from the accompanying drawings.

DETAILED DESCRIPTION

Figure 1:
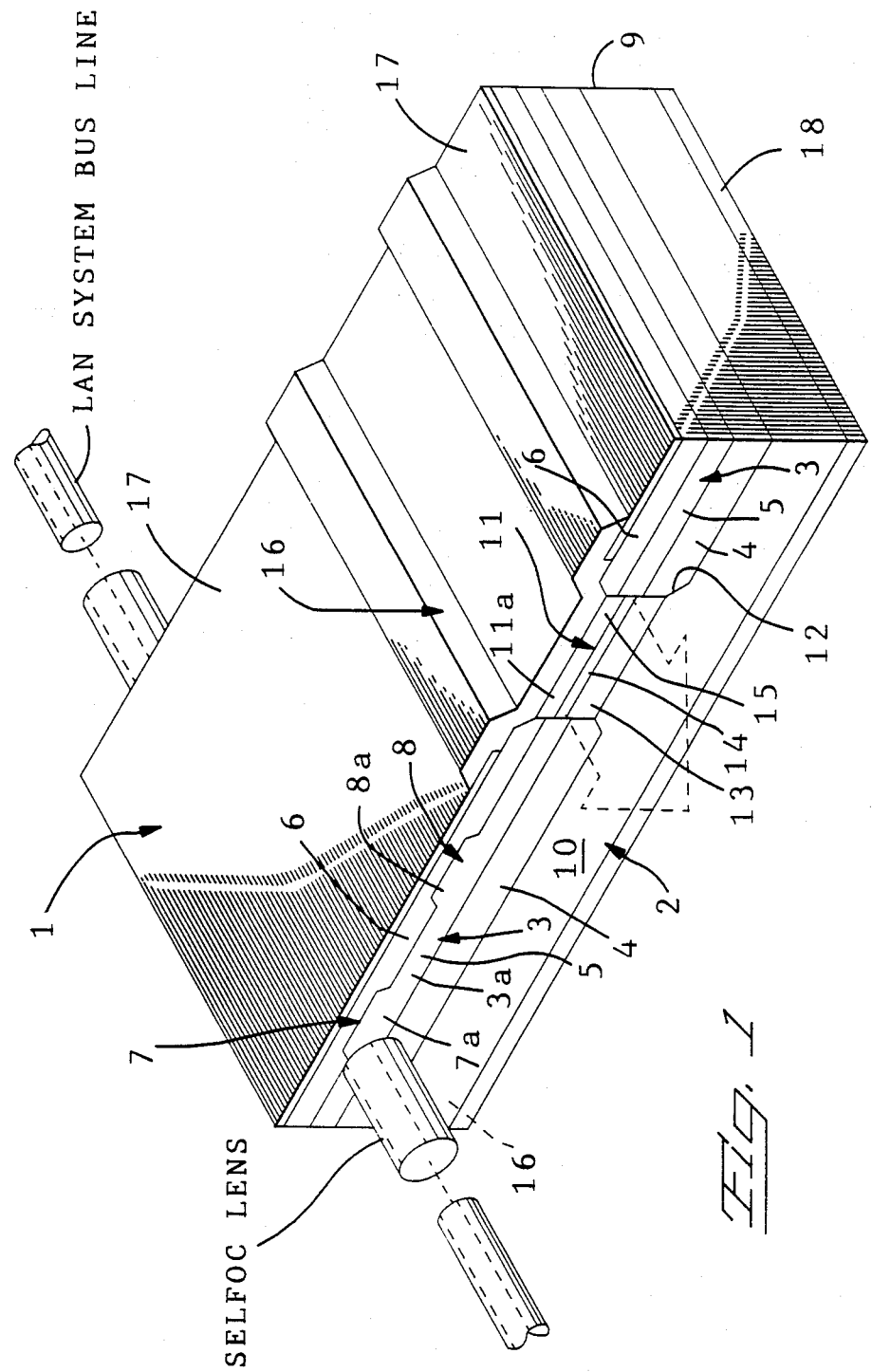
FIG. 1 is an enlarged perspective view of a semiconductor device according to the invention.

FIG. 1 shows a semiconductor device 1 of thin film layers fabricated by known photolithographic techniques. A first layer 2 is a substrate of N doped Gallium Arsenide, N Ga As. An optical transmitting medium 3 engages and covers the substrate, and is formed of three consecutive semiconductor layers. A first layer 4 and a third layer 6 of Aluminum(x) Gallium(1-x) Arsenide, Al(x) Ga(1-x) As, acts as optical cladding for a second and intermediate layer 5 of Aluminum(x) Gallium(1-x) Arsenide, Al (x) Ga(1-x) As. The first and third layers 4, 6 of the optical transmitting medium 3 is selected with an index of refraction greater than the index of refraction of the second layer 5, thereby providing an optical transmission path along the second layer 5 and extending generally parallel to the substrate 2.

A first waveguide 7 and a second waveguide 8 are formed by relatively thick and projecting strips of the substance comprising the second layer 5. The first waveguide 7 and the second waveguide 8 are shown in FIG. 1 with trapezoidal cross sections between the layers 4, 6 of optical cladding. According to the techniques referred to in U.S. Pat. No. 4,146,297, the waveguides 7, 8 are constructed with geometries that provide optical coupling along a length of interaction that is shown in FIG. 1 as coinciding with a length of the semiconductor device 1 from an edge 9 of the semiconductor device 1 to an edge 10.

A third optical waveguide 11 operating as a semiconductor amplifier is formed on a mesa 12 of the substrate 2 having a length extending from the edge 9 to the edge 10. The third optical waveguide 11 is formed with a first optical cladding layer 13 of N doped Aluminum(y) Gallium (1-y) Arsenide, Al(y) Ga(1-y) As, a third optical cladding layer 15 of P doped Aluminum(y) Gallium (1-y) Arsenide, Al(y) Ga(1-y) As, and a second optically transmissive layer 14 of p doped Aluminum(y) Gallium (1-y) Arsenide, Al(y) Ga(1-y) As interposed between the first and third layers 13, 15 and having an optical index of refraction less than that of the first layer 13 and the third layer 15. The second layer 14 is aligned with the optical transmission medium 3. The first waveguide 7 and the third waveguide 11 are constructed with geometries that provide optical coupling along a length of interaction that is shown in FIG. 1 as coinciding with a length of the semiconductor device 1 from the edge 9 to the edge 10. The edge 10 of the semiconductor device 1 is coated with an optical antireflective coating of known composition. Thereby the waveguides 7, 8, 11 and the optical transmission medium 3 have emitting edges, 7a, 8a, 11a, 3a, respectively, that are coated to inhibit reflection of optical signals having a direction of propogation from the edge 9 to the edge 10.

A conductive metal electrode 16 is formed as a layer on the cladding layer 15 of the third waveguide 11 and engages a metal oxide layer 17 covering the cladding layer 6 of the optical transmission medium 3. The third waveguide 11 operates as an optical amplifier when an electrical voltage is applied across the electrode 16 and an outer conductive metal layer 18 applied on the substrate 2, causing an electrical current to flow through the Np junction of the third waveguide 11. The third waveguide 11 is an amplifier for a portion of an optical signal that is optically coupled into the third waveguide 11 from the first waveguide 7. The portion of the optical signal is amplfied and coupled back to the first waveguide 7 which transmits an optical signal that is amplified by the coupled back amplified portion of the signal.

The amount of power gain for a wavelength of the optical signal can be adjusted and can be ascertained by selecting the amount of phase mismatch attributed to a first optical coupling of the signal transmitting waveguide or first waveguide 7 and the second waveguide 8 that is interposed between the amplifier or third waveguide 11 and the signal transmitting waveguide 7. An amount of phase mismatch in a second optical coupling between the first waveguide 7 and the third waveguide 11 is desireable.

Figure 2:
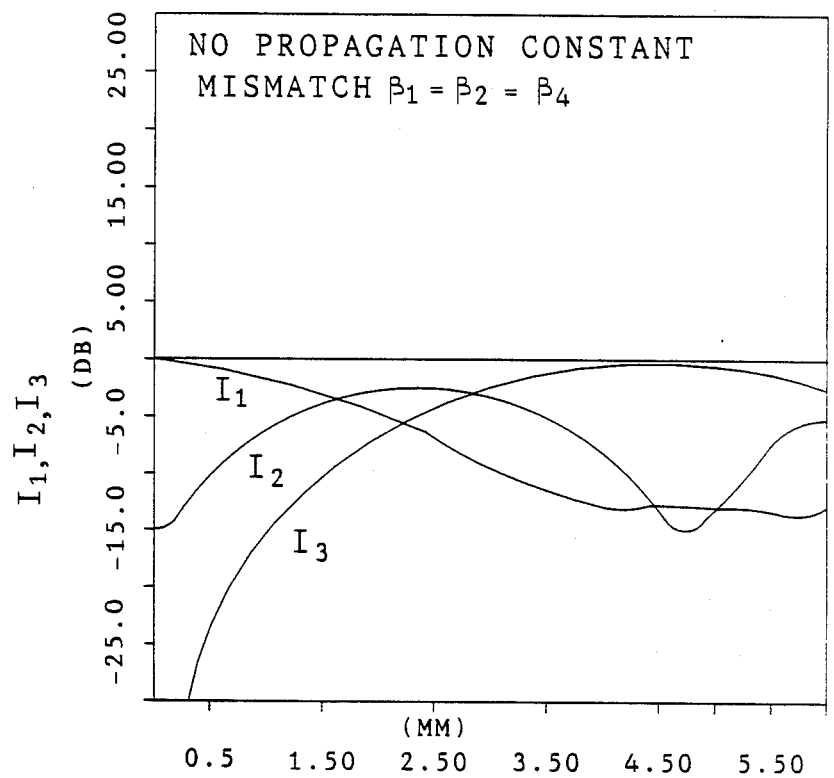
FIG. 2 is a graph of the optical power fluctuation.

FIG. 2 is a graph of the optical power fluctuation in decibells for an optical signal transmitted by the waveguides 7, 8, 11 versus the optical interaction length of the optical couplings in millimeters, and for the condition of no phase mismatch of the first coupling and no phase mismatch of the second coupling. Optical power for an optical signal transmitted by the first waveguide 7 is graphically illustrated as I1. Optical power I2 of the optical signal transmitted by the second waveguide 8 increases due to optical coupling with the first waveguide 7, and then decreases due to optical coupling of a portion of an optical signal from the second waveguide 8 into the third waveguide 11. For illustration purposes, the optical coupling of nonamplified power into the waveguide 7 from the second waveguide 8 is disregarded as beng insubstantial. Optical power I3 of an optical signal in the third waveguide 11 increases due to optical coupling with the first and the second waveguides 7, 8 and due to amplification of the optical signal. The amplified portion of the optical signal will begin to be coupled into the second waveguide 8, thereby causing the graphically shown increase in I2 following the graphically shown decrease in I2. Optical power I1 dissipates due to optical coupling of portions of the signal into the second waveguide 8 and into the third waveguide 11 with no net gain in I1.

Figure 3:
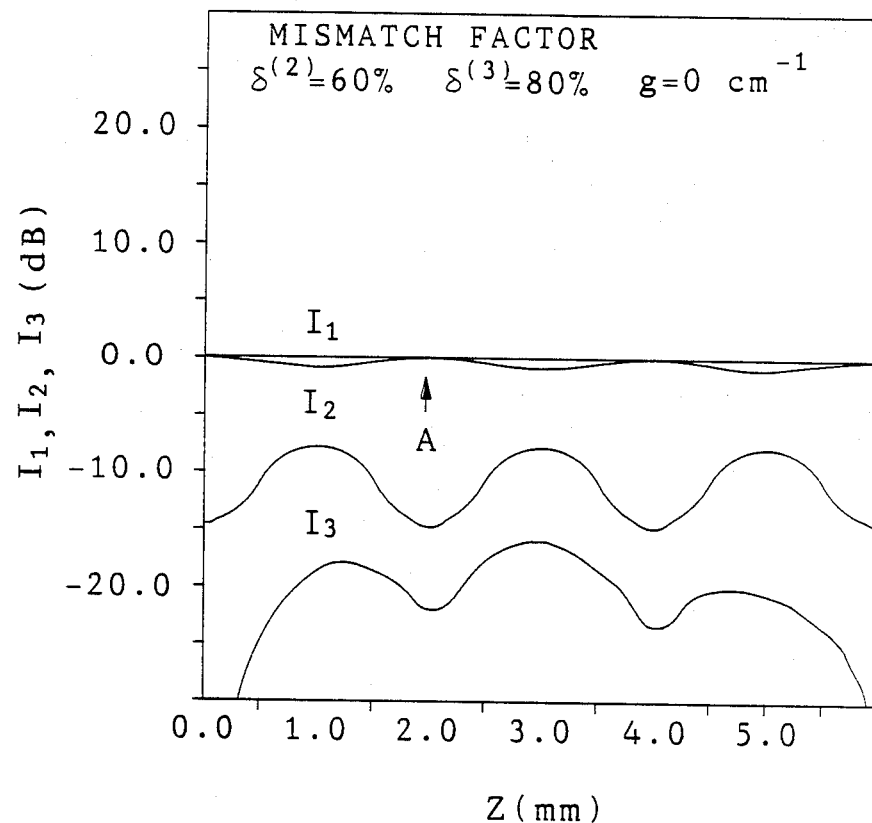
FIG. 3 is a graph of the optical power gain.

FIG. 3 is a graph of the optical power gain in decibells for an optical signal in the waveguides 7, 8, 11 versus the coupled interaction length of the waveguides 7, 8, 11 in millimeters, for a fixed phase mismatch factor attributed to each of the optical couplings. For the first optical coupling of the first waveguide 7 and the second waveguide 8, the phase mismatch factor Delta (2) equals 60%, and for the second optical coupling of the first waveguide 7 and the third waveguide 11, the phase mismatch factor is 80%, wherein phase mismatch factor is the per cent of phase match between the respective second and third waveguides 8, 11 in the corresponding couplings with the first waveguide 7. I2 is the optical power gain of the optical signal present in the second waveguide 8, I3 is the optical power gain of the optical signal in the third waveguide 11, and I1 is the optical power gain of the optical signal present in the first waveguide 7, that dissipates from the reference value 0.0 due to optical coupling of portions of the optical signal into the second waveguide 8 and the third waveguide 11, and increases to a maximum value per centimeter of interaction length, at point labeled A on the graph of I1, which value has been increased to the maximum value that can be attained due to amplified optical signal coupled back by the amplifier into the first waveguide 7. At point A, the power gain amount is shown without regard to an irrelevant amount of nonamplified signal coupled back from the second waveguide 8 without amplification by the third waveguide 11. For the fixed phase mismatch factors of 60% and 80%, the maximum gain at point A is zero.

Figure 4:
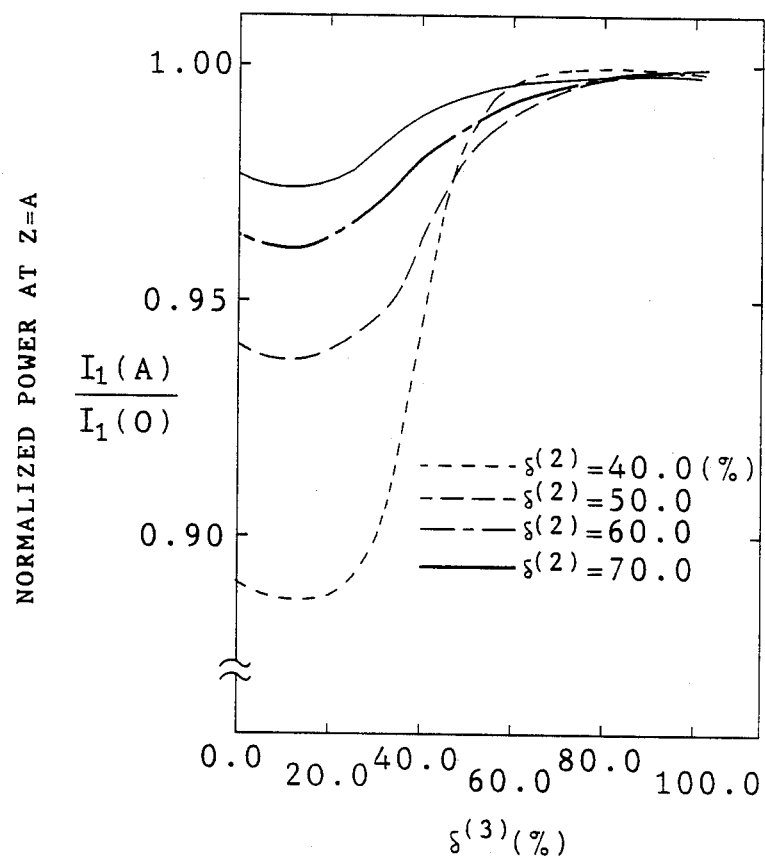
FIGS. 4 and 5 are graphs of the normalized power.

FIG. 4 is a graph of the normalized power, defined as the amplified optical power I1 (a), amplified by the coupled back amplified signal from the amplifier 11, divided by the initial optical power I1 (o) transmitted by the first waveguide 7. The graph represents the normalized power at point labeled A on the graph shown in FIG. 3, versus mismatch factor, Delta (3) of the second optical coupling of the first waveguide 7 and the amplifier or third waveguide 11. The normalized power varies at point A for various values of the mismatch factor Delta (2), defined the same as defined with respect to FIG. 3.

Figure 5:
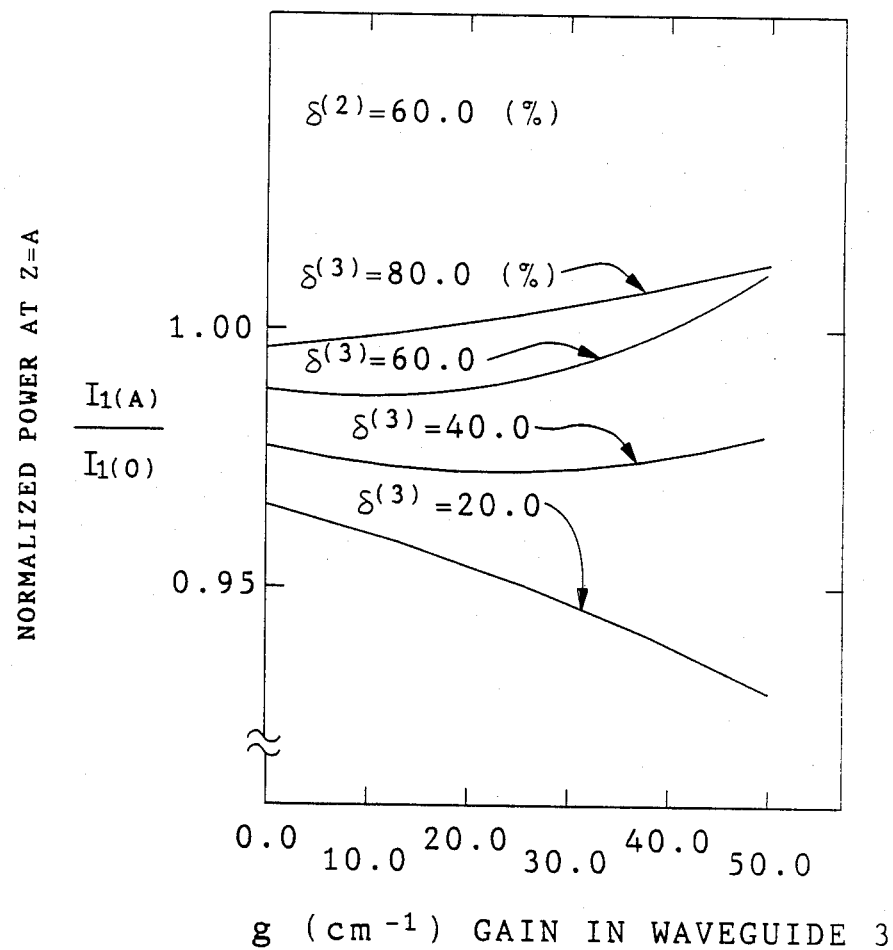

FIG. 5 is a graph of the normalized power, at a point of maximum power gain, similar to point A of the graph of FIG. 3, versus the gain in optical power in the optical signal coupled into the third waveguide 11 per centimeter of interaction length of the optically coupled waveguides 7, 8, 11. According to the graph of FIG. 3, point A showed no net increase in optical power for the mismatch factors represented in FIG. 3. For FIG. 5, The mismatch factor Delta (2) is fixed at 60%. The mismatch factor Delta (3) is varied to show corresponding variations in normalized power along separate graph lines. These graph lines show that a maximum in the value of normalized power can be achieved in excess of the reference value 1.00 of the nonamplified signal transmitted in the first waveguide 7, if for Delta (2) is selected to be a value fixed at 60%, and Delta (3) is selected to be a value of 60% or 80%.

Figure 6:
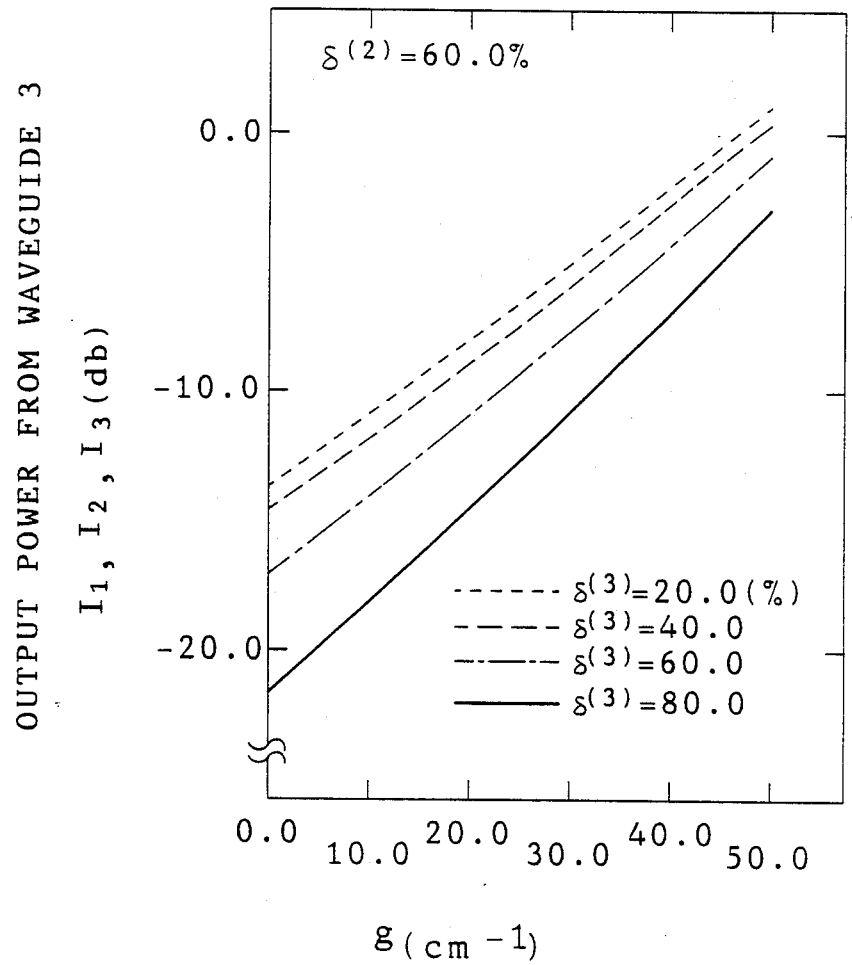
FIGS. 6 and 7 are graphs of the output power.
Figure 7:
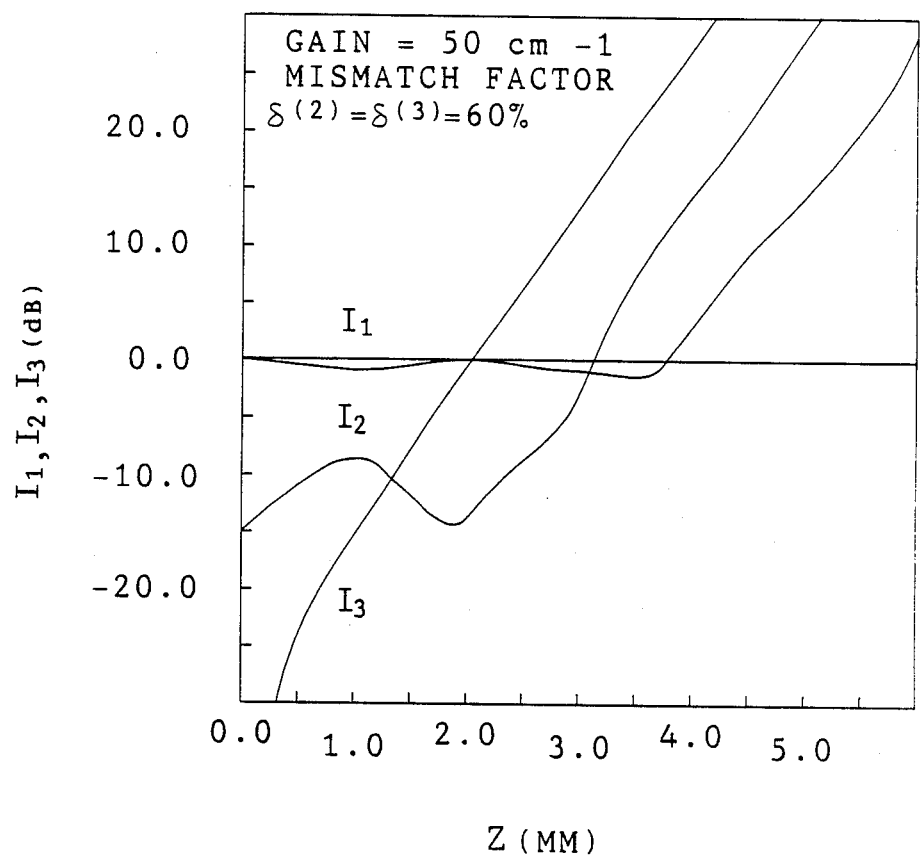

FIG. 6 is a graph of the output power I3 in decibells from the third waveguide 11 versus the gain similarly represented as in FIG. 5, and for Delta (2) fixed at 60%, and Delta (3) varied at the values labeled on the graph, FIG. 7 is a graph of the optical power of the optical signal present in each of the waveguides 7, 8, 11, to achieve a gain of output power from the third waveguide of "g" equals 50 expressed on the graph as per centimeter of the corresponding interaction lengths, and selection of the mismatch factors, Delta (2) equals 605, Delta (3) equals 60%, wherein Z is the interaction length expressed in millimeters and measured along the semiconductor device 1 from the edge 9 to the edge 10.

I claim:

1. A semiconductor amplifying device comprising,
    a substrate,
    a first optical waveguide on the substrate for transmitting an optical signal,
    a second optical waveguide on the substrate,
    a third optical waveguide on the substrate forming an optical coupling with the first optical waveguide along an interaction length and constructed as a semiconductor optical amplifier that receives an amplifies at least a portion of the optical signal and couples at least a portion of the amplified optical signal to the first waveguide, and antireflective means covering light emitting edges at corresponding ends of the respective waveguides,
    the second optical wavelength being interposed between the first optical waveguide and the second optical waveguide, and forming a second optical coupling with the first waveguide along a second interaction length,
    the second optical coupling having a phase mismatch selected for a wavelength of the optical signal to adjust a power gain in the first optical waveguide attributed to an amplified portion of the same wavelength of the optical signal received from the amplifier.

2. A semiconductor amplifying device as recited in claim 1, and further comprising, a light transmitting medium in the substrate in contact with and between the first and second waveguides and in contact with and between the second and third waveguides.

3. A semiconductor amplifying device as recited in claim 2, wherein, the first and second waveguides and the light transmitting medium comprise a layer of light transmitting material juxtaposed between layers of optical cladding material having respective indices of refraction lower than that of the light transmitting material.

4. A semiconductor amplifying device as recited in claim 1, wherein, the third waveguide is a layer of semiconductive optically transmissive material juxtaposed between layers of semiconductive optical cladding, a metal electrode layer on one of the semiconductive optical cladding material, and the other semiconductive optical cladding material is on the substrate.

* * * * *